United States Patent
Yang

(10) Patent No.: US 9,530,841 B1
(45) Date of Patent: Dec. 27, 2016

(54) GATE-ALL-AROUND NANOWIRE FIELD-EFFECT TRANSISTOR DEVICE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/960,442

(22) Filed: Dec. 7, 2015

(30) Foreign Application Priority Data

Nov. 12, 2015 (CN) .......................... 2015 1 0769624

(51) Int. Cl.
| | |
|---|---|
| *H01L 29/32* | (2006.01) |
| *H01L 29/775* | (2006.01) |
| *H01L 29/06* | (2006.01) |
| *H01L 29/423* | (2006.01) |
| *H01L 29/78* | (2006.01) |
| *B82Y 10/00* | (2011.01) |

(52) U.S. Cl.
CPC ........... *H01L 29/0676* (2013.01); *B82Y 10/00* (2013.01); *H01L 29/0649* (2013.01); *H01L 29/0673* (2013.01); *H01L 29/42392* (2013.01); *H01L 29/775* (2013.01); *H01L 29/7848* (2013.01)

(58) Field of Classification Search
None
See application file for complete search history.

(56) References Cited

U.S. PATENT DOCUMENTS

| 8,866,235 B2 | 10/2014 | Wu | |
|---|---|---|---|
| 2013/0228751 A1* | 9/2013 | Gotsmann | B82Y 10/00 257/24 |
| 2013/0264639 A1* | 10/2013 | Glass | H01L 21/28512 257/335 |
| 2014/0131812 A1* | 5/2014 | Wu | H01L 21/82341 257/401 |

FOREIGN PATENT DOCUMENTS

KR  20080072981 A  *  8/2008  ........... H01L 29/786

OTHER PUBLICATIONS

"Cone", from "The Penguin Dictionary of Mathematics", Editor D. Nelson (2008).*
"Frustum", from "The Penguin Dictionary of Mathematics", Editor D. Nelson (2008).*

* cited by examiner

*Primary Examiner* — Johannes P Mondt
(74) *Attorney, Agent, or Firm* — Winston Hsu; Scott Margo

(57) ABSTRACT

A gate-all-around (GAA) nanowire field-effect transistor (FET) device includes a semiconductor substrate, a nanowire on the semiconductor substrate, a gate structure surrounding a central portion of the nanowire, a source/drain region on either side of the gate structure, and at least one dislocation plane in the source/drain region.

14 Claims, 8 Drawing Sheets

GATE-ALL-AROUND NANOWIRE FIELD-EFFECT TRANSISTOR DEVICE

CROSS REFERENCE TO RELATED APPLICATION

This application claims the priority from CN 201510769624.4 filed Nov. 12, 2015, which is included in its entirety herein by reference.

BACKGROUND OF THE INVENTION

1. Field of the Invention

The invention relates to a semiconductor device and a method of forming the same. More particularly, the present invention relates to a gate-all-around (GAA) nanowire field-effect transistor (FET) device with source and drain dislocation and a fabrication method thereof.

2. Description of the Prior Art

It is well known in the art that when a suitable stress in induced in the channel region of a metal-oxide-semiconductor (MOS) transistor, the carrier mobility can be increased, thereby improving the drive current.

Typically, it is preferably to induce tensile stress in the channel region along a source-to-drain direction of an NMOS device and induce compressive stress in the channel region along a source-to-drain direction of a PMOS device. The induced stress may distort semiconductor crystal lattice, thus affecting the energy band alignment of the semiconductor and charge transport properties.

Further, it known that dislocation may be introduced into the source or drain region of the MOS transistor to improve the device performance.

SUMMARY OF THE INVENTION

It is one objective of the invention to provide an improved gate-all-around (GAA) nanowire field-effect transistor (FET) device with source and drain dislocation, thereby enhancing the performance of the GAA nanowire FET device.

To these ends, according to one aspect of the present invention, there is provided a gate-all-around (GAA) nanowire field-effect transistor (FET) device including a semiconductor substrate, a nanowire on the semiconductor substrate, agate structure surrounding a central portion of the nanowire, a source/drain region on either side of the gate structure, and at least one dislocation plane in the source/drain region. According to one embodiment of the invention, the dislocation plane may have a conical shape and may traverse across the entire thickness of the nanowire.

According to one embodiment, the dislocation plane is of a conical frustum shape tapering inward into the nanowire. According to one embodiment, the GAA nanowire FET device is an N-type MOSFET device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 13 are schematic diagrams showing a method for fabricating a gate-all-around (GAA) nanowire field-effect transistor (FET) device according to one embodiment of the invention, wherein FIG. 2 is a cross-sectional view taken along line A-A' in FIG. 1 and FIG. 6 is a cross-sectional view taken along line B-B' in FIG. 5.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 1:
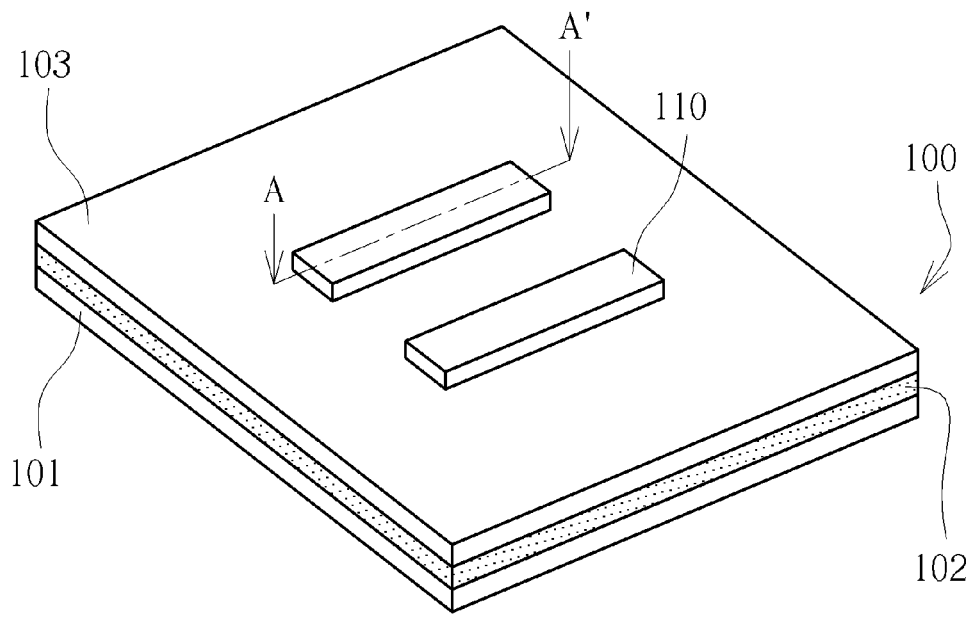
Figure 2:
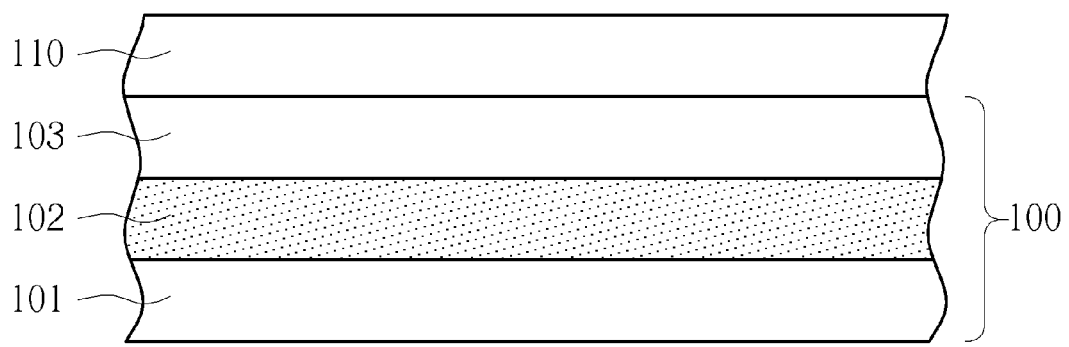

Please refer to FIG. 1 to FIG. 13. FIG. 1 to FIG. 13 are schematic diagrams showing a method for fabricating a gate-all-around (GAA) nanowire field-effect transistor (FET) device according to one embodiment of the invention. First, as shown in FIG. 1 and FIG. 2, a semiconductor substrate 100 is provided. For example, semiconductor substrate 100 may be a silicon-on-insulator (SOI) substrate including a base 101, an insulating layer 102 such as an oxide layer, and a single crystalline silicon layer 103. Next, mandrels 110 may be formed on the single crystalline silicon layer 103.

The mandrels 110 may include silicon oxide or other materials having etching selectivity relative to the underlying single crystalline silicon layer 103, such as polysilicon. Precisely speaking, each mandrel 110 is preferably spaced from each other, such that, a pitch may be performed between any two of the adjacent mandrels 110, but not limited thereto.

It is to be understood that the above-described SOI substrate is for illustration purposes only. In another embodiment, other suitable substrates may be employed.

Figure 3:
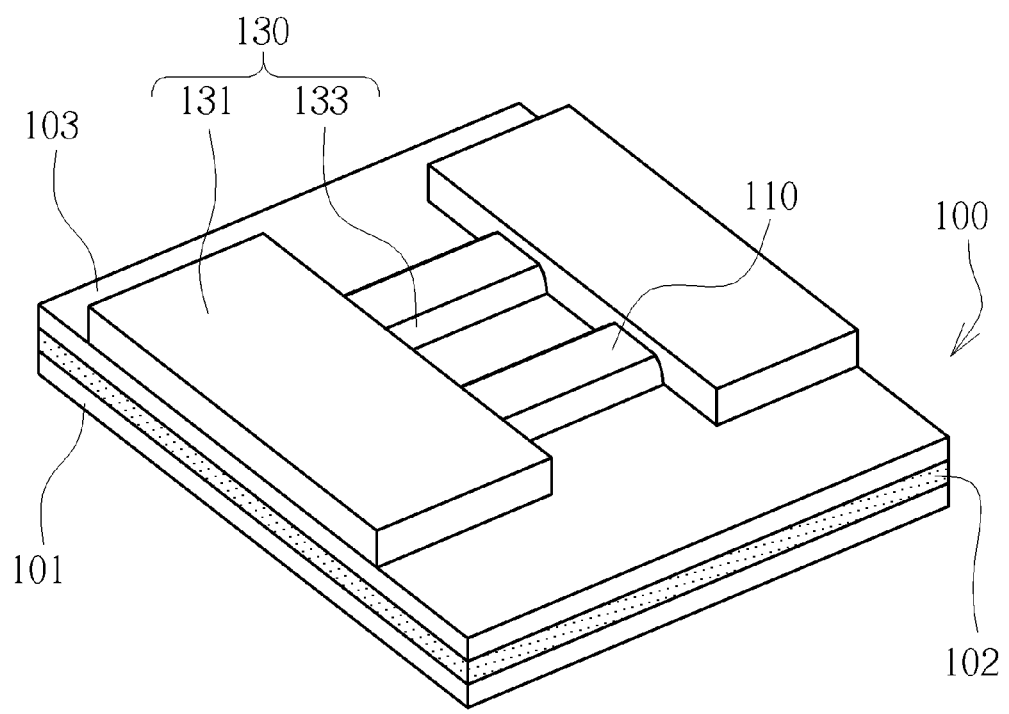

As shown in FIG. 3, a hard mask layer 130 is formed on the single crystalline silicon layer 103, to configure as a mask of defining the nanowire structure formed subsequently. The hard mask layer 130 may include silicon nitride or other materials having etching selectivity relative to the single crystalline silicon layer 103. The formation of the hard mask layer 130 may include firstly forming a mask material layer (not shown in the drawings) on the SOI substrate 100 to cover the SOI substrate 100 and the mandrels 110, and a photolithography and etching process is performed to partially remove the mask material layer, thereby forming the hard mask layer 130 covered a portion of the mandrels 110.

It is noted that, the hard mask layer 130 may include a connection portion 131 covering each mandrel 110, and an extension portion 133 being adjacent to sidewalls of each mandrel 110 for surrounding them.

Figure 4:
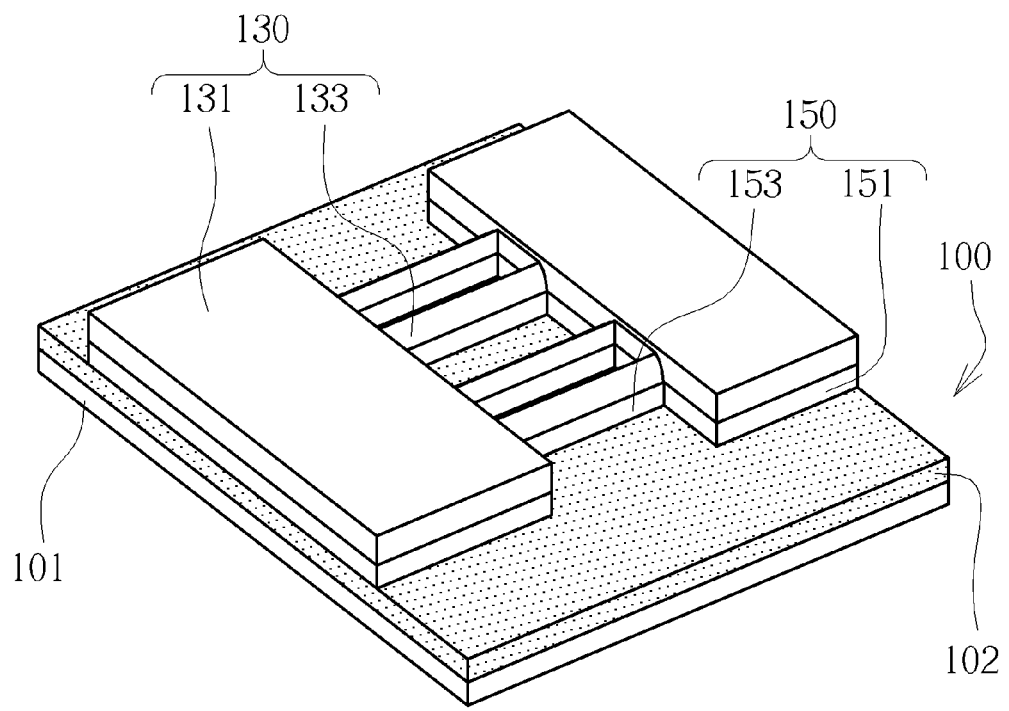

Subsequently, as shown in FIG. 4, the mandrels 110 are removed, and an etching process is performed by using the hard mask layer 130 as a mask. Through such performance, a portion of the single crystalline silicon layer 103 may be removed, so as to form a nanowire structure 150 in the single crystalline silicon layer 103 of the SOI substrate 100. The nanowire structure 150 may include two connection pads 151 and at least one nanowire 153 between the connection pads 151. According to the embodiment, the nanowire 153 is a silicon nanowire.

Precisely speaking, a two-step etching process may be performed after the mandrels 110 are removed, for example including firstly performing an anisotropic etching process or a vertical etching process, such as dry etching, to expose the insulating layer 102 of the SOI substrate 100 not covered by the hard mask layer 130.

In one embodiment, while performing the anisotropic etching process or the vertical etching process, the parameters of the etching process may be preferably adjusted to form undercut, and the hard mask layer 130 is then removed. Following that, an isotropic etching process or a lateral etching process may be performed, such as wet etching, to further etch sidewalls of the nanowire structure 150.

However, it is to be understood that the etching process of the present invention is not limited to the aforementioned steps, and may include other methods. In another embodiment, the two-step etching process may also be performed sequentially both using the hard mask layer 130 as a mask, to form a nanowire structure (not shown in the drawings) having connection pads (not shown in the drawings) and a nanowire (not shown in the drawings) leveled with each other, and the hard mask layer 130 is removed then.

Figure 5:
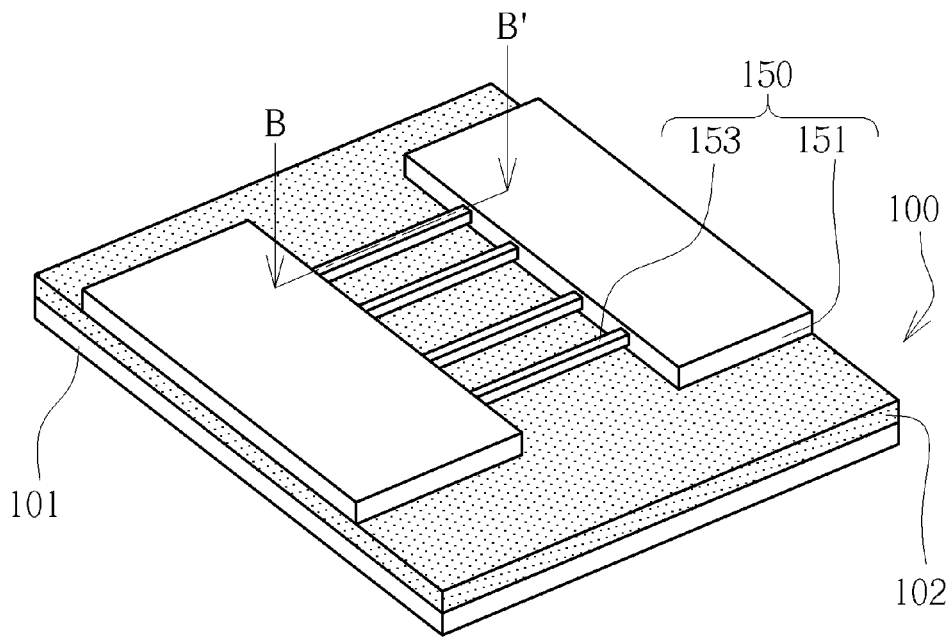
Figure 6:
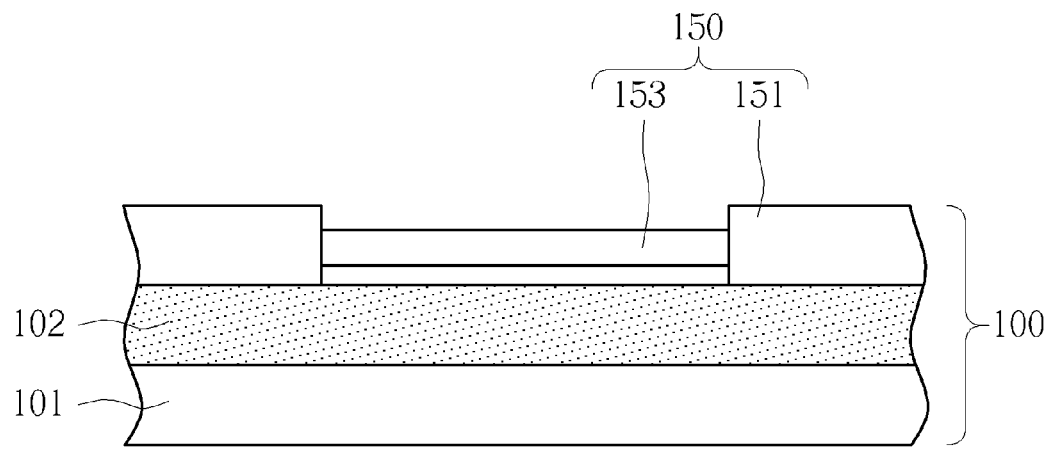

It is worth noting that, while performing the etching process, the hard mask layer 130 may shelter the nanowire structure 150, so that, the single crystalline silicon layer 103 adjacent to the hard mask layer 130 may be etched relatively slower, and the single crystalline silicon layer 103 away from the hard mask layer 130 may be etched relatively faster. On the other hand, since the nanowire 153 has a relatively small size compared to that of the connection pads 151, the single crystalline silicon layer 103 thereof away from the hard mask layer 130 may easily experience bottom cutting while two sides of the nanowire 153 are both etched isotropically. In other words, a portion of the nanowire 153 adjacent to the insulating layer 102 may be removed, and only the portion of the nanowire 153 adjacent to the hard mask layer 130 may remain to form the nanowire 153 across between the connection pads 151, as shown in FIG. 5 and FIG. 6.

Also in another embodiment, a portion of the insulating layer 102 may also be further removed optionally, so that, the nanowire 153 may further space apart from the insulating layer 102 and a gate structure formed subsequently may completely surround the nanowire 153.

Figure 7:
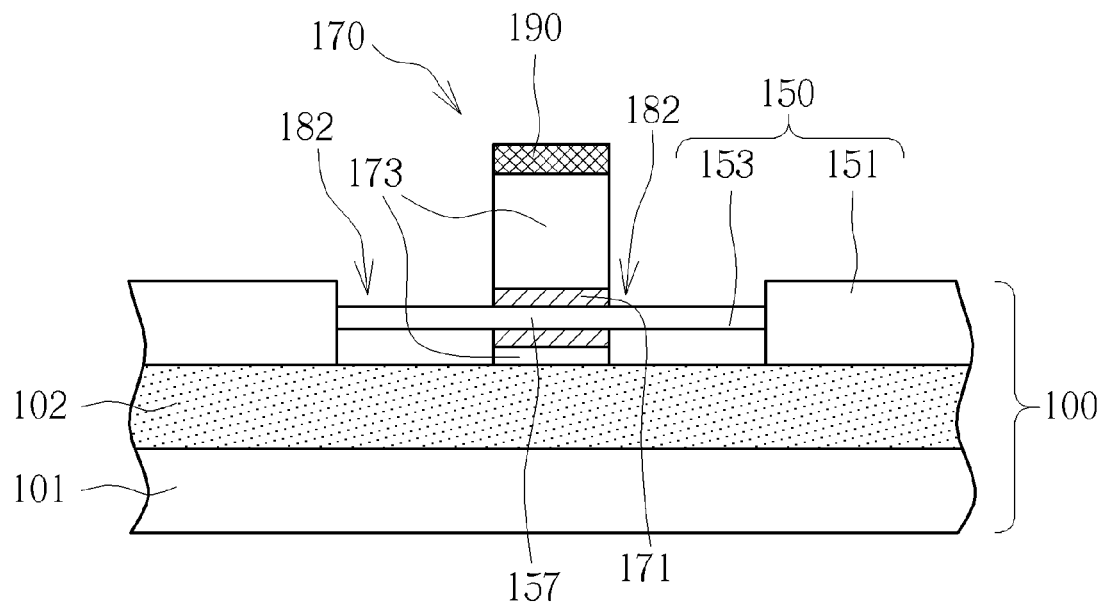

Subsequently, as shown in FIG. 7, a gate structure 170 cross the nanowire 153 may be formed. Precisely, the formation of the gate structure 170 may include sequentially forming a gate dielectric layer (not shown in the drawings), like silicon oxide, silicon nitride, silicon oxynitride or other suitable high dielectric constant materials, for example, and a gate layer (not shown in the drawings), like polysilicon, silicide or some suitable work function metals or metal materials, for example, on the SOI substrate 100 and the nanowire structure 150; forming a patterned mask layer 190; and patterning the gate dielectric layer and the gate layer by using the patterned mask layer 190 as a mask, thereby forming the gate electrode 173 at least partially surrounding the nanowire 153 and the gate dielectric layer 171 disposed between the gate electrode 173 and the nanowire 153. Source/drain regions 182 are disposed on both sides of the gate electrode 173, thereby defining a channel region 157. Suitable dopants may be implanted into the source/drain regions 182.

Figure 8:
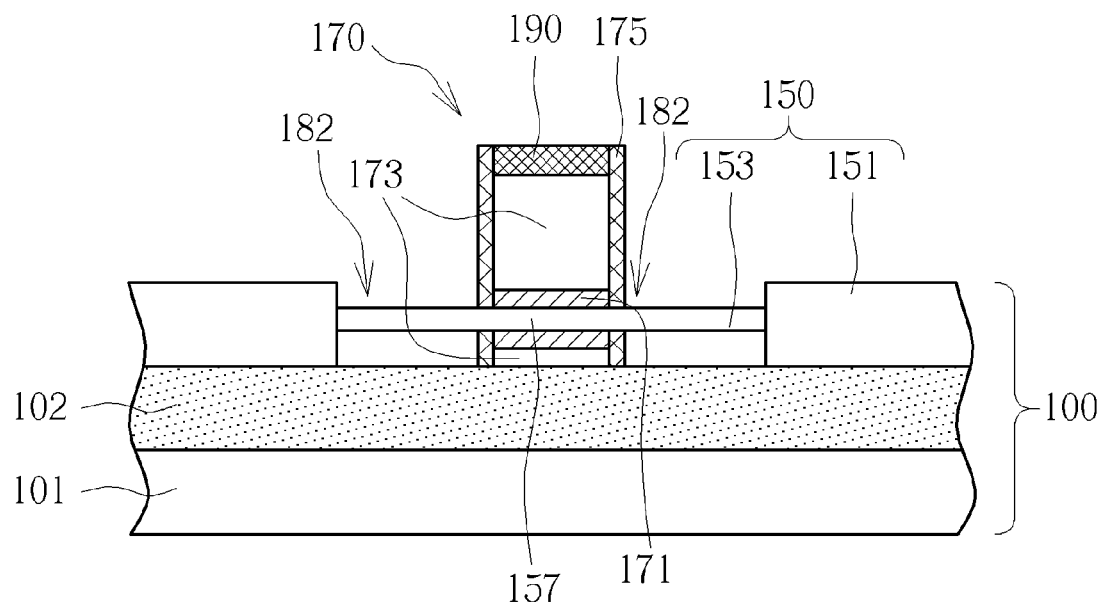

Furthermore, as shown in FIG. 8, a spacer 175 surrounding the gate structure 170 may be formed. The spacer 175 may include a monolayer structure of a multilayer structure of silicon nitride or silicon oxide, and the forming method thereof may be integrated into a conventional semiconductor process or shall be well known in the art, and will not be further detailed herein.

Figure 9:
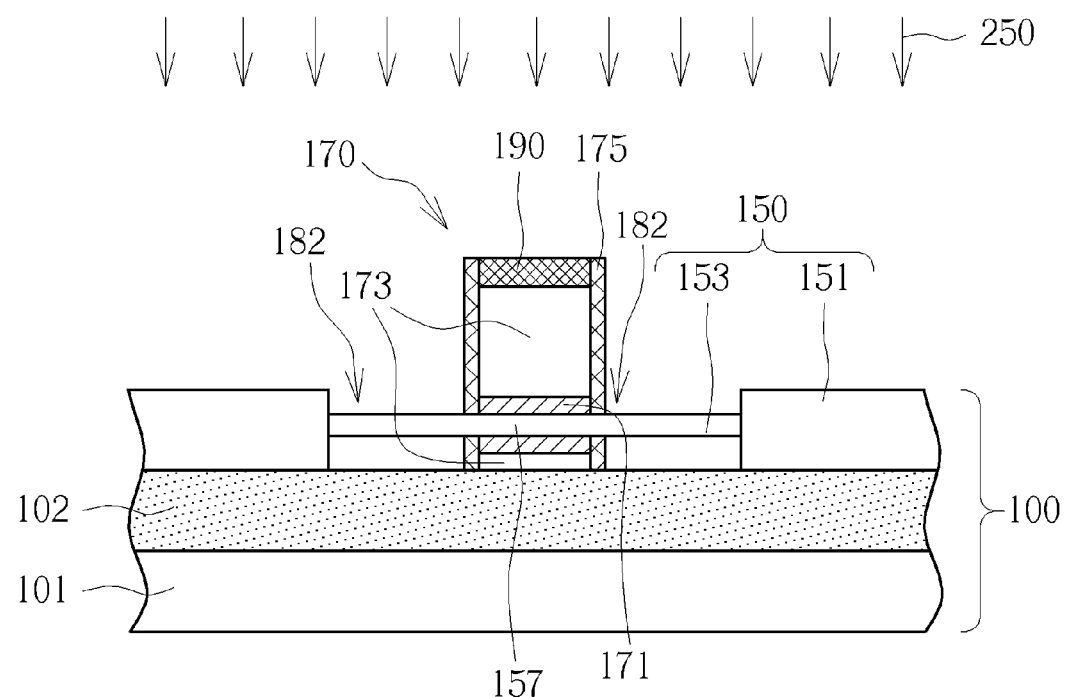

As shown in FIG. 9, a pre-amorphized implantation (PAI) process 250 is performed to bombard the area not covered by the gate structure 170. For example, the PAI process 250 may use germanium ions or other suitable ions. In the aforesaid PAI process 250, the well-controlled the energy and dose of the implantation process may cause damage to the silicon crystal lattice, thereby forming an amorphous layer. The structure of the amorphous layer may reduce boron channeling and transient enhanced diffusion.

Figure 10:
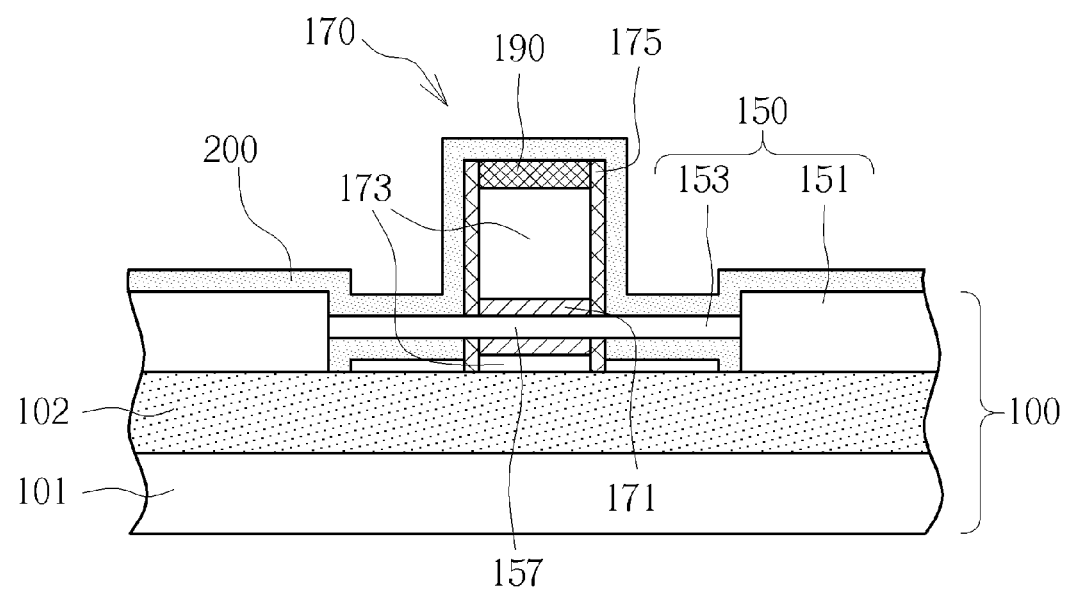

Subsequently, a stress memorized technique (SMT) is performed. A stress layer 200 such as silicon nitride or silicon oxide is deposited in areas that are not covered by the gate structure 170 and also on the gate structure 170 using a chemical vapor deposition method, as shown in FIG. 10. For example, for N-type MOSFETs, the stress layer 200 may be a tensile-stressed film, and for the P-type MOSFETs, the stress layer 200 may be a compressive-stressed film. According to one embodiment of the invention, the GAA nanowire FET device is an N-type MOSFET, the stress layer 200 is a tensile-stressed film.

Figure 11:
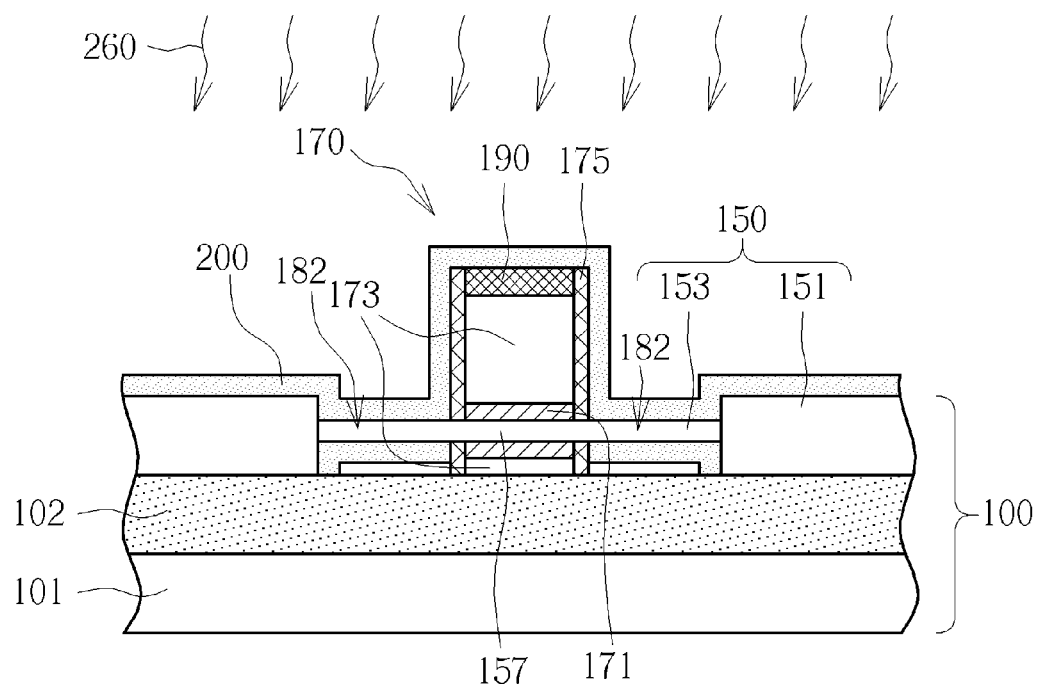

As shown FIG. 11, an annealing process 260, for example, in a temperature range of 400° C. to 1500° C., is performed, thereby transferring the stress in the stress layer 200 to the gate structure 170. Because the polysilicon in the gate electrode 173 and the silicon atoms in the source/drain regions 182 re-crystallize, the vertical compressive stress and the tensile stress along the longitudinal direction of the device induced in the channel region 157 can enhance the electron mobility in the N-type MOSFET.

Figure 12:
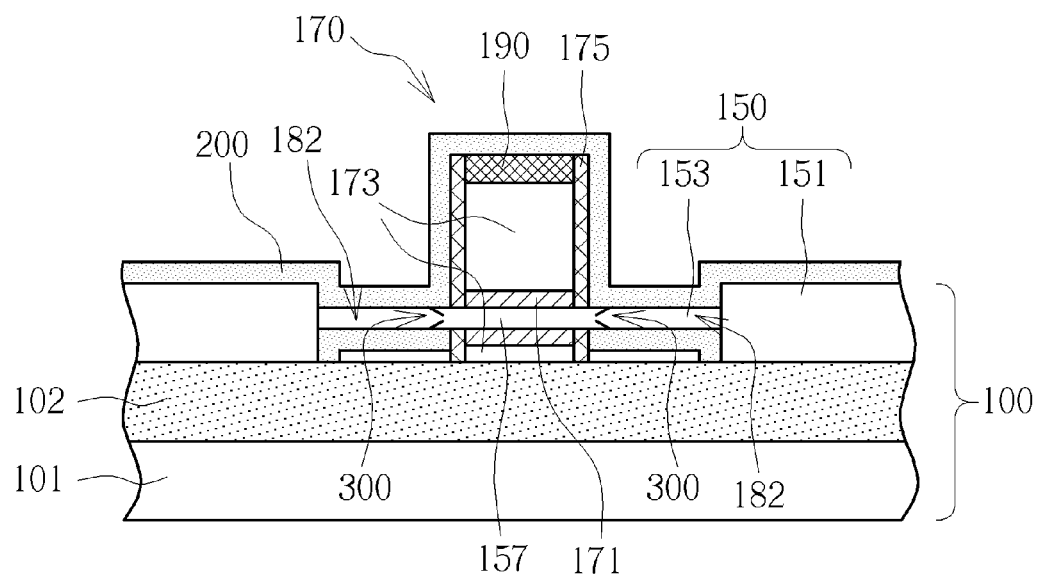

As shown FIG. 12, after the annealing process, the recrystallization of the silicon atoms in the source/drain regions 182 may generate dislocation planes 300 adjacent to the channel region 157. According to one embodiment of the invention, the dislocation planes 300 traverse the entire thickness of the nanowire 153. The dislocation planes 300 may comprise curved planes or flat planes, but not limited thereto.

Figure 13:
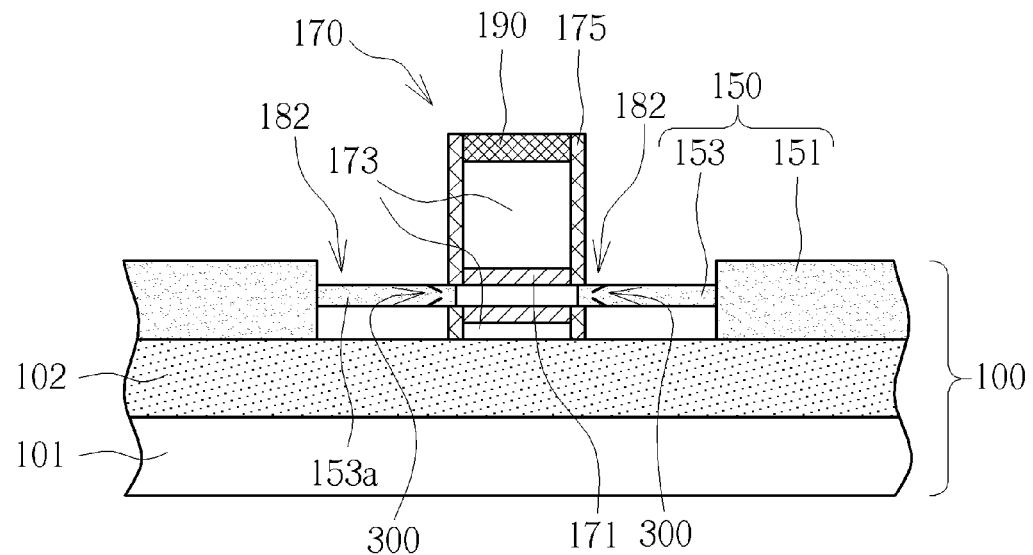

As shown FIG. 13, the stress layer 200 is removed. Subsequently, an epitaxial stress-inducing material 153a is grown on the source/drain regions 182. The aforesaid epitaxial stress-inducing material 153a may comprise silicon carbide (SiC), silicon phosphide (SiP), phosphorus-doped silicon carbide (SiCP), or combinations thereof.

Figure 14:
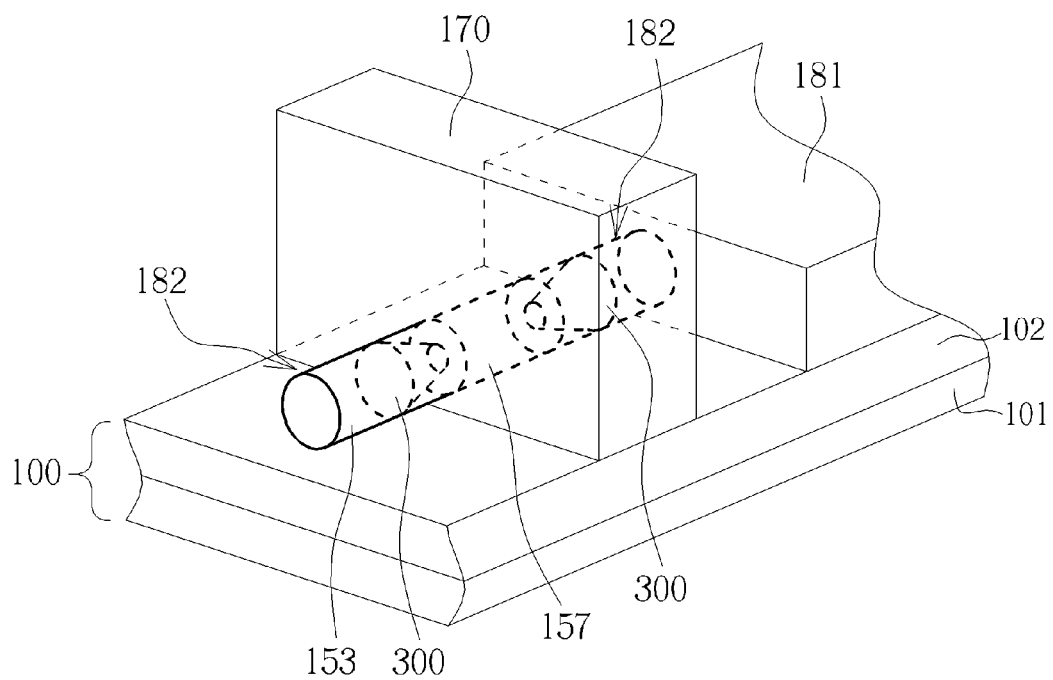
FIG. 14 is a schematic perspective diagram showing an exemplary dislocation plane in the nanowire of the GAA nanowire FET device according to one embodiment of the invention.

As shown FIG. 14, for example, each dislocation plane 300 may have a three-dimensional, tapering conical frustum shape around the nanowire 153, tapering inward from the surface of the nanowire 153 into the nanowire 153 and extending a distance, for example, 5 nm to 50 nm, from the surface of the nanowire 153 to the channel region 157, but not limited thereto. The dislocation planes 300 may induce stress into the channel region 157, thereby enhancing the performance of the GAA nanowire FET device.

Structurally, as can be seen in FIG. 13 and FIG. 14, the GAA nanowire FET device of the present invention comprises a semiconductor substrate (e.g. SOI substrate) 100, a nanowire 153 on the semiconductor substrate 100, a gate structure 170 surrounding a central portion of the nanowire 153, a source/drain region 182 on either side of the gate structure 170, and at least one dislocation plane 300 in the source/drain region 182. The dislocation plane 300 is of a tapered conical or conical frustum shape. The gate structure 170 comprises a gate dielectric layer 171 and a gate electrode 173. The gate electrode 173 may comprise a metal gate electrode or a metal gate layer.

Figure 15:
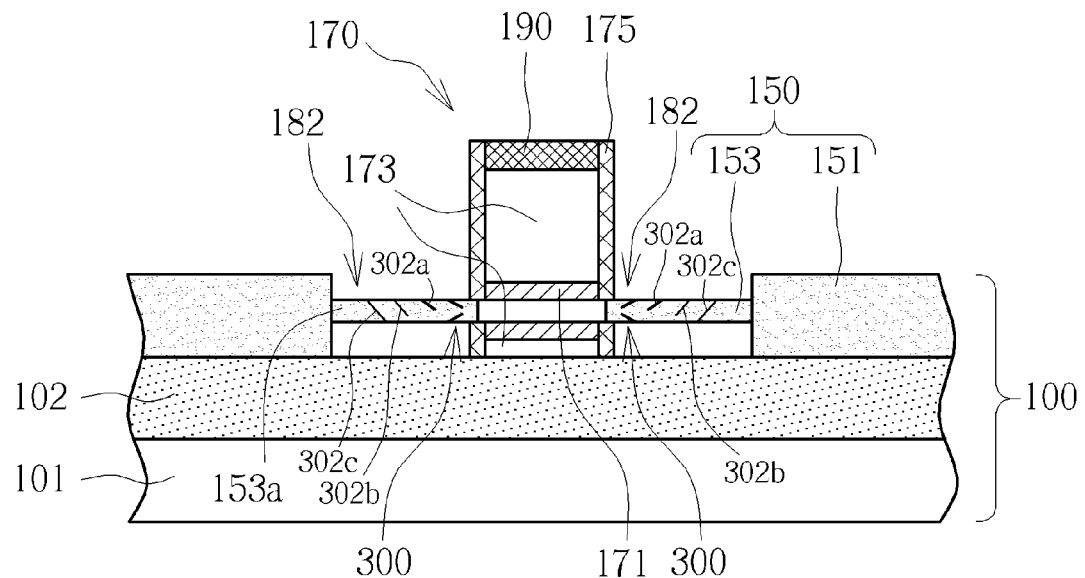
FIG. 15 is a schematic, cross-sectional diagram showing a GAA nanowire FET device according to another embodiment of the invention.

FIG. 15 is a schematic, cross-sectional diagram showing a GAA nanowire FET device according to another embodiment of the invention. Although FIG. 14 shows a single dislocation plane 300 in the nanowire 153 on either side of the gate structure 170, it is understood that in another embodiment of the invention, additional dislocation planes may be formed on each side of the gate structure 170, for example, as shown in FIG. 15, the dislocation planes 301a-302c. The dislocation planes 302a, 302b, 302c may extend a predetermined distance from the surface of the nanowire 153 into the nanowire 153 and to the channel region 157.

According to another embodiment of the present invention, as shown in FIG. 15, the aforesaid predetermined distance of dislocation planes 302a, 302b and 302c extending from the surface of the nanowire 153 into the nanowire 153 may be different. For example, the extending distance of the dislocation plane 302a is smaller than that of the dislocation plane 302b, and the extending distance of the dislocation plane 302b is smaller than that of the dislocation plane 302c, but not limited to the arrangement and order in this figure. As shown in FIG. 15, for example, the dislocation plane 302c may span the entire thickness of the nanowire 153, and the dislocation planes 302a and 302b do not span the entire thickness of the nanowire 153.

Figure 16:
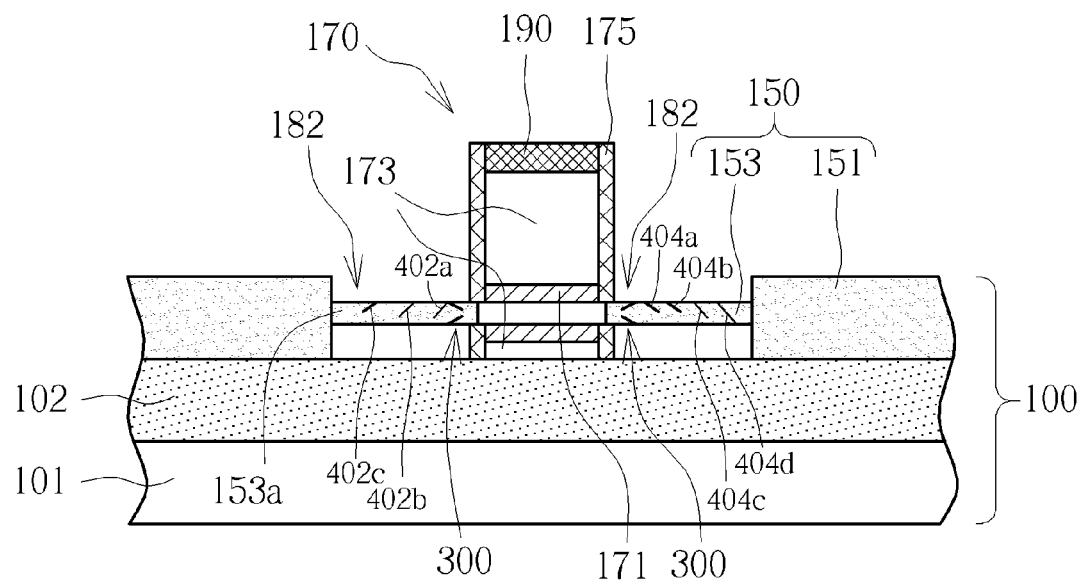
FIG. 16 is a schematic, cross-sectional diagram showing a GAA nanowire FET device according to still another embodiment of the invention.

FIG. 16 is a schematic, cross-sectional diagram showing a GAA nanowire FET device according to still another embodiment of the invention. According to this embodiment, different numbers of dislocation planes in addition to the dislocation planes 300 may be disposed in the nanowire 153 on two sides of the gate structure 170. For example, as shown in FIG. 16, on the left side of the gate structure 170, three extra dislocation planes 402a-402c may be formed in the nanowire 153, and on the right side of the gate structure 170, four extra dislocation planes 404a-404d may be formed in the nanowire 153. The dislocation planes 402a-402c and 404a-404d may extend a predetermined distance from the surface of the nanowire 153 into the nanowire 153 and to the connection pads 151. The extending distances of the dislocation planes 402a-402c and 404a-404d from the surface of the nanowire 153 into the nanowire 153 may be different from one another.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A gate-all-around (GAA) nanowire field-effect transistor (FET) device, comprising:
   a semiconductor substrate;
   a nanowire on the semiconductor substrate;
   a gate structure surrounding a central portion of the nanowire;
   one source/drain region on each one of two opposing sides of the gate structure; and
   at least one dislocation plane with a shape of conical frustum in each of the source/drain regions.

2. The GAA nanowire FET device according to claim 1, wherein the gate structure comprises a gate dielectric layer and a metal gate layer on the gate dielectric layer.

3. The GAA nanowire FET device according to claim 1 further comprising a spacer on a sidewall of the gate structure.

4. The GAA nanowire FET device according to claim 1 further comprising an epitaxial stress-inducing material in the source/drain regions.

5. The GAA nanowire FET device according to claim 4, wherein the epitaxial stress-inducing material comprises SiC, SiP, SiCP, or a combination thereof.

6. The GAA nanowire FET device according to claim 1, wherein the nanowire is a silicon nanowire.

7. The GAA nanowire FET device according to claim 1, wherein the GAA nanowire FET is an N-type metal-oxide-semiconductor field effect transistor.

8. The GAA nanowire FET device according to claim 1, wherein the semiconductor substrate comprises a silicon-on-insulator (SOI) substrate.

9. The GAA nanowire FET device according to claim 1, wherein the nanowire is disposed between two connection pads.

10. The GAA nanowire FET device according to claim 1, wherein the substrate comprises an oxide layer and the nanowire suspends above the oxide layer.

11. The GAA nanowire FET device according to claim 1, further comprising additional dislocation planes in each of the source/drain regions.

12. The GAA nanowire FET device according to claim 11, wherein the additional dislocation planes have different extending distances.

13. The GAA nanowire FET device according to claim 12, wherein at least one of the additional dislocation planes spans the entire thickness of the nanowire.

14. The GAA nanowire FET device according to claim 11, wherein the numbers of the additional dislocation planes in each of the source/drain regions are different.

* * * * *